(12) United States Patent
Mizuno

(10) Patent No.: US 7,989,053 B2
(45) Date of Patent: Aug. 2, 2011

(54) ELECTROCONDUCTIVE DIFFUSE REFLECTIVE FILM AND METHOD OF PRODUCING THE SAME

(75) Inventor: Masao Mizuno, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 354 days.

(21) Appl. No.: 12/325,673

(22) Filed: Dec. 1, 2008

(65) Prior Publication Data
US 2009/0176121 A1    Jul. 9, 2009

(30) Foreign Application Priority Data
Jan. 8, 2008   (JP) .................................. 2008-001455

(51) Int. Cl.
    *B41M 5/00*      (2006.01)
    *B32B 5/16*       (2006.01)
    *B32B 3/06*       (2006.01)
(52) U.S. Cl. ..................... 428/195.1; 428/206; 428/207; 428/208; 428/304.4; 428/307.3; 428/323; 428/328

(58) Field of Classification Search ............... 428/195.1, 428/206, 209, 208, 304.4, 307.3, 323, 328
See application file for complete search history.

(56) References Cited

U.S. PATENT DOCUMENTS
7,674,401 B2 *   3/2010   Maruyama .................... 252/500

FOREIGN PATENT DOCUMENTS
| JP | 2006-123463 | 5/2006 |
| JP | 2006-258849 | 9/2006 |
| JP | 2006-335935 | 12/2006 |

OTHER PUBLICATIONS
U.S. Appl. No. 12/330,066, filed Dec. 8, 2008, Mizuno.

* cited by examiner

*Primary Examiner* — Gwendolyn Blackwell
(74) *Attorney, Agent, or Firm* — Oblon, Spivak, McClelland, Maier & Neustadt, L.L.P.

(57) ABSTRACT

An electroconductive diffuse reflective film is made of an electroconductive metal, wherein the electroconductive diffuse reflective film has a porous structure in which crystal grains having an average grain diameter of 50 nm or more and 1,000 nm or less are separately arranged at intervals of 10 nm or more and 800 nm or less on average.

7 Claims, 13 Drawing Sheets

US 7,989,053 B2

ELECTROCONDUCTIVE DIFFUSE REFLECTIVE FILM AND METHOD OF PRODUCING THE SAME

BACKGROUND OF THE INVENTION

1. Field of the Invention

The present invention relates to an electroconductive diffuse reflective film and a method of producing the same.

2. Description of the Related Art

Various types of reflectors are used in lighting apparatuses, decorative illumination signboards, displays, and the like. Examples of such reflectors include metal reflectors having a high visible-light reflectance and white reflectors that exhibit white reflection, and such reflectors are used in the form of a film, a sheet, or a plate.

Among these reflectors, metal reflectors include a reflective film made of a metal material such as silver, aluminum, or a stainless steel, each of which has a high visible-light reflectance. Such metal reflectors are used as a headlight reflector for an automobile, a fluorescent lamp reflector, an incandescent lamp reflector, a telescope reflecting mirror, a reflecting mirror for a solar cell, and a sunlight-condensing plate. Such metal reflectors are supplied as a film having a metal film or a metal film-coated plate. Physical vapor deposition such as vapor deposition or sputtering is often used as a method of forming such a film having a metal film, or a metal film coating.

Furthermore, since such a metal reflector has a high reflectance and a high electrical conductivity, the metal reflector can be used as a reflecting electrode combining a function of reflecting light from the outside and a function of an electrode. For example, in some reflective liquid crystal displays, metal wiring for driving liquid crystal molecules and transistors also functions as a reflecting electrode. Examples of a product that requires a similar reflecting electrode include a reflector of a solar cell electrode, electronic paper, and an electrochromic display.

Most visible light incident on a surface of a metal reflector is totally reflected in a direction of an angle of reflection equal to an angle of incidence, and thus, the mirror reflectance, that is, the regular reflectance is high. When the angle of reflection deviates from the regular reflection, the reflectance significantly decreases. In addition, as is apparent from the fact that a metal plate functions as a mirror, the surroundings are reflected at the surface of the metal reflector as a mirror image. Therefore, a metal reflector may be disadvantageous when being used as a reflecting electrode. For example, a metal reflector is used in a reflective display device. In this case, an image of a viewer may be reflected on a screen at some angles because of mirror-like reflection caused by the reflector. In addition, glare of the screen occurs at an angle at which reflection is strong. Furthermore, reflection is strong at certain angles and is weak at other angles. Accordingly, a viewer may recognize variations in the screen because of the nonuniform reflection. For such a reflective device, reflection similar to reflection that occurs at white paper, in which the mirror reflectance is decreased and the diffuse reflectance is increased, can provide uniform and smooth impressions rather than mirror reflection similar to reflection that occurs at a mirror at which reflection strongly occurs.

On the other hand, a white reflector is used as a reflector of a fluorescent lamp or an incandescent lamp on which reflection or glare does not occur. For example, a resin application method, a method of coating a white pigment, a method of sintering a ceramic powder such as a barium sulfate powder are practically used as a method of preparing such a white reflector. Since such a white reflector is composed of an insulator, the white reflector does not function as an electrode and cannot be used as a reflecting electrode. If a white reflector has a high electrical conductivity, characteristics of images can be improved.

Furthermore, insulating white reflectors are used as reflectors in various fields. For example, in a transmissive liquid crystal display, an insulating white reflector is used as a backlight reflector. In general, a fluorescent tube, an electroluminescent (EL) plate, or a LED light is used as a backlight disposed on the back surface of such a transmissive liquid crystal display. A reflector for efficiently utilizing light from the backlight is used at the back surface of the backlight. A metal mirror plate has been used as this reflector, but the use of a white reflector has also been proposed. For example, Japanese Unexamined Patent Application Publication No. 2006-335935 proposes a thermoplastic resin foam having fine air bubbles inside as a reflector suitable for use in a light reflector of a display.

In addition, recently, as the output of backlights (fluorescent tubes) of transmissive liquid crystal displays has increased, the temperature of backlight units has also increased. To solve this problem, it has been necessary to take heat-dissipation measures. An example of such a heat-dissipation measure is improvement of the heat-dissipating effect. For example, Japanese Unexamined Patent Application Publication Nos. 2006-258849 and 2006-123463 propose that a heat-dissipating film be formed on a white pigment film provided on a surface of an aluminum plate. Furthermore, as another example of a heat-dissipation measure, it is also effective to improve thermal conductivity of a reflector. In general, in metal materials, heat conduction due to free electrons is dominant, and thus a material having a high electrical conductivity also has a high thermal conductivity. Accordingly, if a metal material having a high electrical conductivity can be used as a white reflector, such a white reflector is also effective from the standpoint of a heat-dissipation measure because of its high thermal conductivity.

In a method of applying an insulating white coating material onto a metal base material, the effect of heat conduction is significantly decreased by applying the insulating material on a surface of the metal base material, though a metal plate in used as the metal base material. Therefore, it is preferable that such a coating is not used. Furthermore, electroconductive white reflectors can be used not only for display but also for illumination, decorative illumination, a solar cell electrode having irregularities thereon, and the like. A material that achieves white reflection and that has a high electrical conductivity has been desired in these fields.

However, known metal reflectors have a high electrical conductivity, but achieves low diffuse reflection. On the other hand, white reflectors on which painting, a resin coating, or an oxide powder coating is performed can achieve high diffuse reflection, but do not function as an electrode because such white reflectors are made of an insulator. Accordingly, it has been difficult to obtain a reflective film and a reflector that can combine white diffuse reflection and electrical conductivity (a low electrical resistivity).

SUMMARY OF THE INVENTION

It is an object of the present invention to provide an electroconductive diffuse reflective film that has a high electrical conductivity and that achieves high diffuse reflection, and a method of producing the same.

In order to achieve the above object, the inventors of the present invention have conducted intensive studies and found that a diffuse reflective film having a high electrical conductivity could be obtained by making a metal thin film porous. It has been found that, in particular, by controlling the diameter of crystal grains constituting the thin film to be 50 nm or more and 1,000 nm or less, and forming a porous structure in which a gap of 10 nm or more and 800 nm or less is present between the crystal grains, a white diffuse reflective film can be produced while maintaining a high electrical conductivity. As a result of intensive studies performed in order to form a metal thin film having such a porous structure, it has been found that the electroconductive diffuse reflective film having the above porous structure can be formed by mixing hydrogen in an amount of 0.05% or more and 30% or less with an atmosphere gas in physical vapor deposition.

More specifically, according to a first aspect of the present invention, an electroconductive diffuse reflective film is composed of an electroconductive metal, wherein the electroconductive diffuse reflective film has a porous structure in which crystal grains having an average grain diameter of 50 nm or more and 1,000 nm or less are separately arranged at intervals of 10 nm or more and 800 nm or less on average.

This electroconductive diffuse reflective film is composed of an electroconductive metal and has a porous structure in which crystal grains having an average grain diameter of 50 nm or more and 1,000 nm or less are separately arranged at intervals of 10 nm or more and 800 nm or less on average. Accordingly, the electroconductive diffuse reflective film can have a high electrical conductivity and exhibit a high diffuse reflectance.

In the electroconductive diffuse reflective film, each of the crystal grains is preferably composed of a plurality of microcrystals finer than the crystal grains.

According to this electroconductive diffuse reflective film, each of the crystal grains is composed of a plurality of microcrystals finer than the crystal grains, and thus satisfactory diffuse reflection can be realized.

In the electroconductive diffuse reflective film, the thickness of the electroconductive diffuse reflective film is preferably 50 nm or more and 20 μm or less.

According to this electroconductive diffuse reflective film, by controlling the thickness of the reflective film to be 50 nm or more and 20 μm or less, the reflective film can have a high electrical conductivity, does not transmit light, and can exhibit a high diffuse reflectance.

In the electroconductive diffuse reflective film, the electroconductive metal is preferably aluminum or an aluminum alloy.

According to this electroconductive diffuse reflective film, since the electroconductive metal constituting the reflective film is aluminum or an aluminum alloy, a reflective film having a high electrical conductivity can be obtained.

In the electroconductive diffuse reflective film, the electrical resistivity of the reflective film is preferably 2.7 μΩcm or more and 100 μΩcm or less.

According to this electroconductive diffuse reflective film, since the electrical resistivity of the reflective film is 2.7 μΩcm or more and 100 μΩcm or less, the reflective film can exhibit high electrical conductivity.

In the electroconductive diffuse reflective film, a reflectance ratio B/A of a reflectance B of light having a wavelength of 550 nm incident at an angle of incidence of −5 degrees and reflected at an angle of reflection of 45 degrees to a reflectance A of light having a wavelength of 550 nm incident at an angle of incidence of −5 degrees and reflected at an angle of reflection of 5 degrees with respect to a direction perpendicular to the surface of the film, is 0.2 or more and 0.6 or less.

This electroconductive diffuse reflective film is composed of an electroconductive metal and has a porous structure in which crystal grains having an average grain diameter of 50 nm or more and 1,000 nm or less are separately arranged at intervals of 10 nm or more and 800 nm or less on average. Consequently, the reflectance ratio B/A is 0.2 or more and 0.6 or less, and thus a high diffuse reflectance can be obtained.

In the electroconductive diffuse reflective film, the diffuse reflectance of light having a wavelength of 550 nm is preferably 30% or more and 90% or less.

This electroconductive diffuse reflective film is composed of an electroconductive metal and has a porous structure in which crystal grains having an average grain diameter of 50 nm or more and 1,000 nm or less are separately arranged at intervals of 10 nm or more and 800 nm or less on average. Consequently, the diffuse reflectance of light having a wavelength of 550 nm is 30% or more and 90% or less, and thus a white diffuse reflective film can be obtained.

According to a second aspect of the present invention, a method of producing an electroconductive diffuse reflective film made of an electroconductive metal and having a porous structure includes a step of depositing a film made of a vapor deposition material on a substrate by physical vapor deposition using a film deposition gas containing hydrogen in an amount of 0.05% or more and 30% or less and a vapor deposition source made of the vapor deposition material containing the electroconductive metal.

According to this method, an electroconductive diffuse reflective film made of an electroconductive metal and having the above-described porous structure can be deposited on a substrate by physical vapor deposition using a film deposition gas containing hydrogen in an amount of 0.05% or more and 30% or less and a vapor deposition source made of a vapor deposition material containing the electroconductive metal.

In the method, the film deposition gas is preferably a rare gas that does not substantially contain oxygen or nitrogen.

According to this method, by using a rare gas that does not substantially contain oxygen or nitrogen as the film deposition gas, an electroconductive diffuse reflective film having the above-described porous structure can be obtained.

In the method, the step of deposition is preferably performed by sputtering at a film deposition gas pressure in the range of 3 to 100 mTorr and at an electric power supplied in the range of 2 to 20 W/cm$^2$.

According to this method, an electroconductive diffuse reflective film having the above-described porous structure and combining a high electrical conductivity and a high diffuse reflectance can be deposited by sputtering at a film deposition gas pressure in the range of 3 to 100 mTorr and at an electric power supplied in the range of 2 to 20 W/cm$^2$.

The electroconductive diffuse reflective film of the present invention has a high electrical conductivity and a high diffuse reflectance. A reflector including this diffuse reflective film can be suitably used as a reflector electrode.

According to the method of the present invention, an electroconductive diffuse reflective film having a high electrical conductivity and a high diffuse reflectance can be produced.

DESCRIPTION OF THE PREFERRED EMBODIMENTS

Figure 1:
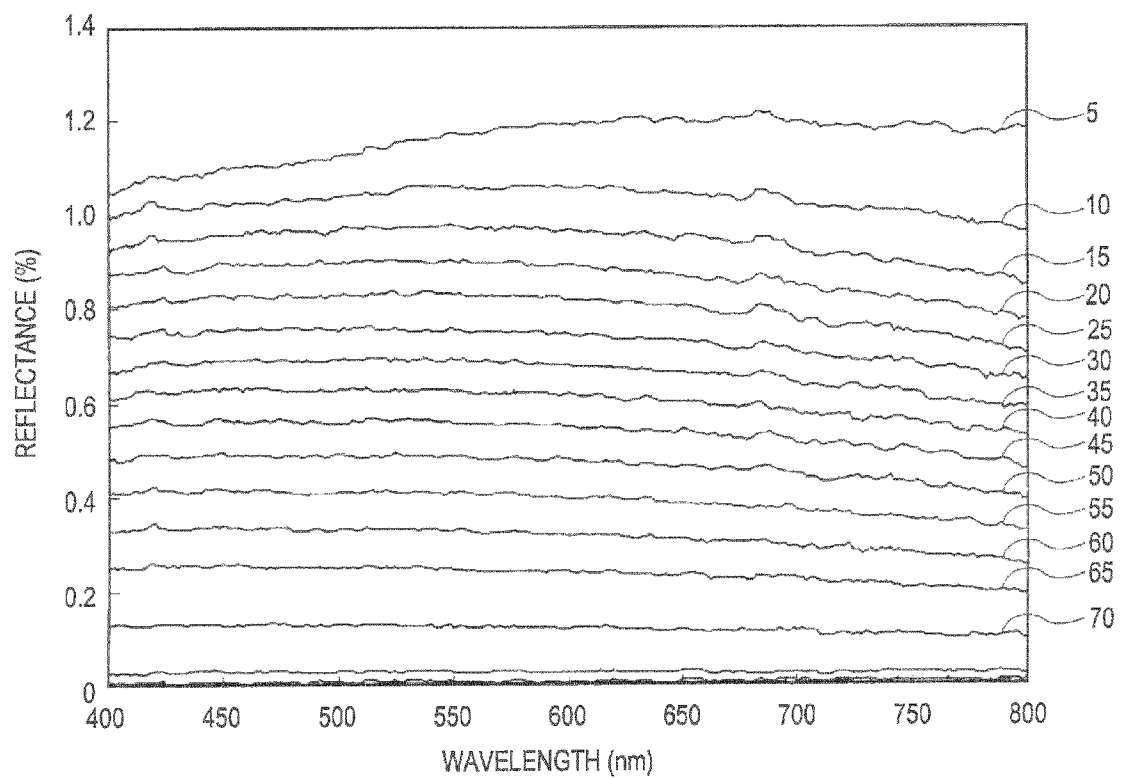
FIG. 1 is a graph showing measurement results of the reflectance in Example 1.

An electroconductive diffuse reflective film of the present invention (hereinafter referred to as "reflective film of the present invention") and a method of producing the same will now be described in detail.

The reflective film of the present invention has a porous structure composed of an electroconductive metal. Examples of the electroconductive metal that can be used include aluminum, and aluminum alloys, silver, titanium, nickel, chromium, and manganese. Among these, aluminum or an aluminum alloy is preferable because this metal can be formed into a white diffuse reflective film having electrical conductivity and a porous structure. Examples of the aluminum alloy include aluminum alloys containing an alloying element such as Si, Mg, Mn, Cu, Zn, Fe, Ni, Ti, Pb, or Cr from the standpoint of high corrosion resistance and heat resistance. In general, the amount of alloying element contained in the aluminum alloy is preferably in the range of about 0.01 mass percent to 15.0 mass percent from the standpoint that the alloying element should not affect a diffuse reflection phenomenon caused by the formation of a porous structure, and that a sufficient electrical resistivity and reflectance of the resulting reflective film can be ensured.

The porous structure of the reflective film of the present invention is composed of crystal grains having an average grain diameter of 50 nm or more and 1,000 nm or less. When the average grain diameter of the crystal grains is less than 50 nm, irregularities on the surface are excessively small, and thus, the effect of diffuse reflection is low. On the other hand, when the average grain diameter of the crystal grains exceeds 1,000 nm, metallic reflection in a specific direction increases, thereby causing nonuniform metallic reflection. As a result, uniform diffuse reflection does not occur. A preferable average grain diameter of the crystal grains is 100 nm or more and 800 nm or less. These crystal grains may have a structure of secondary grains formed by aggregating a plurality of finer microcrystals (primary grains). From the standpoint of achievement of satisfactory diffuse reflection, each of the crystal grains is preferably composed of secondary grains in which about 2 to 10 fine microcrystals (primary grains) having an average grain diameter of 25 nm or more and 75 nm or less aggregate. The shapes of the crystal grains and the fine microcrystals are not limited to a spherical shape. The crystal grains and the fine microcrystals are grains having a substantially spherical outer shape which also includes irregular outer shapes distorted in one or two or more directions as compared with a spherical shape. The average grain diameter thereof is the average of an outer diameter measured in directions of at least two axes that pass through the center of the grain.

Furthermore, the porous structure of the reflective film of the present invention is a structure in which crystal grains are separately arranged at intervals of 10 nm or more and 800 nm or less on average. More specifically, a gap of 10 nm or more and 800 nm or less on average is present between crystal grains forming the porous structure. Accordingly, a white diffuse reflective film having a high electrical conductivity and a high diffuse reflectance can be obtained. When the distance between crystal grains is less than 10 nm, diffuse reflection does not satisfactorily occur in the gap portions, and thus the effect of diffuse reflection cannot be achieved. When the distance exceeds 800 nm, the strength of the structure decreases because the structure becomes excessively porous. In such a case, a diffuse reflective film may not be held. A preferable distance between crystal grains is in the range of 20 to 600 nm. In the present invention, the term "distance between crystal grains" means the distance between the nearest outer surfaces of adjacent crystal grains.

The thickness of the reflective film of the present invention is preferably 50 nm or more and 20 μm or less. When the film thickness is in the range of 50 nm or more and 20 μm or less, part of light is not transmitted through the thin film and the film satisfactorily functions as a reflective film. Furthermore, in the above range, detachment of the film from a substrate due to a compressive stress generated inside the film does not occur. In general, diffuse reflection does not satisfactorily occur in an area where the film thickness is small. On the other hand, in the case of a large film thickness, the surface is excessively roughened and the diffuse reflectance may become uneven. More preferably, the thickness of the reflective film is 100 nm or more and 4 μm or less.

In the reflective film of the present invention, a reflectance ratio B/A is preferably 0.2 or more and 0.6 or less. Accordingly, sufficient diffuse reflection can be achieved, and a satisfactory white reflective film can be obtained. In addition, a phenomenon in which strong nonuniform reflection locally occurs only in a certain specific direction other than the direction of regular reflection, for example, only in the direction of 45 degrees can be prevented, and thus uniform diffuse reflection can be achieved. Herein, the reflectance ratio B/A means the ratio of a reflectance B of light having a wavelength of 550 nm incident at an angle of incidence of −5 degrees and reflected at an angle of reflection of 45 degrees to a reflectance A of light having a wavelength of 550 nm incident at an angle of incidence of −5 degrees and reflected at an angle of reflection of 5 degrees with respect to a direction perpendicular to the film surface. More preferably, the reflectance ratio is 0.3 or more and 0.55 or less.

The diffuse reflectance of the reflective film of the present invention is preferably 30% or more and 90% or less. Accordingly, a sufficiently high total reflectance can be obtained on the surface of the film. Therefore, the reflective film is suitable for used in a reflecting electrode, and a reflectance sufficient for the application to a reflector can be obtained. Herein, the term "diffuse reflectance" means a value obtained by integrating the reflectance of light at each angle diffused in directions in the range of 5 degrees to 90 degrees when light having a wavelength of 550 nm is incident at an angle of 0 degrees with respect to a direction perpendicular to a substrate. Further preferably, the diffuse reflectance is 40% or more and 90% or less.

Furthermore, the electrical resistivity of the reflective film of the present invention is preferably 2.7 μΩcm or more and 100 μΩcm or less from the standpoint that the reflective film should exhibit an electrical conductivity sufficient for use as an electrode. When the electrical resistivity exceeds 100 μΩcm, the film can be applied to an antistatic film.

Furthermore, a protective film made of, for example, $SiO_2$, $TiO_2$, or $MgF_2$ may be formed on the reflective film of the present invention, as needed.

The reflective film of the present invention can be produced by a method including a step of depositing a film made of a vapor deposition material by physical vapor deposition using a film deposition gas containing hydrogen and a vapor deposition source made of the vapor deposition material containing an electroconductive metal. In addition to the step of depositing the film by physical vapor deposition, this method further includes, for example, a step of cleaning a surface of a substrate, a step of preheating the substrate whose surface has been cleaned, a step of after-treating the substrate on which the reflective film of the present invention has been deposited, and a step of forming a protective film made of, for example, $SiO_2$, $TiO_2$, or $MgF_2$.

The substrate on which the reflective film of the present invention is to be deposited is not particularly limited, and appropriately selected in accordance with, for example, the application, the function, and the form of a diffuse reflector having the reflective film of the present invention on a surface thereof. For example, when the substrate is used for the application of a lighting apparatus, a decorative illumination signboard, a display, a headlight reflector for an automobile, a fluorescent lamp reflector, an incandescent lamp reflector, a telescope reflecting mirror, a reflecting mirror for a solar cell, or a sunlight-condensing plate, a film, a sheet, a plate, or an insulating or electroconductive substrate material such as a glass plate or a metal plate can be used in accordance with the application, the function, and the form of the reflector. A glass substrate having a smooth surface or a normal metal substrate is better than a substrate on which fine irregularities are provided on a surface thereof, for example, an anodized aluminum substrate. Alternatively, when the substrate is used as a reflecting electrode used in, for example, a reflective liquid crystal display, a solar cell electrode having irregularities thereon, a reflector of a solar cell electrode, electronic paper, or an electrochromic display, or used as a reflector of a backlight of a transmissive liquid crystal display or the like, for example, the shape and the form of the substrate can be appropriately selected in accordance with the shape of the reflecting electrode or the like.

A rare gas that does not substantially contain oxygen or nitrogen is used as the film deposition gas. In the present invention, the phrase "not substantially contain oxygen or nitrogen" means that the oxygen content is 1 ppm or less, and the nitrogen content is 10 ppm or less. Examples of the rare gas used include Ar, He, and Ne.

The hydrogen content in this film deposition gas is 0.05% or more and 30% or less. Thereby, an electroconductive diffuse reflector having the above porous structure can be deposited. When the hydrogen content is less than 0.05%, the effect of hydrogen is insufficient. On the other hand, a hydrogen content of more than 30% is not realistic because the effect is saturated and the deposition rate decreases. Preferably, the hydrogen content is 0.1% or more and 10% or less. The hydrogen is preferably used in an amount of 5% or less from the standpoint that the content is equal to or lower than the explosive limit of hydrogen.

Examples of the physical vapor deposition include vacuum deposition and sputtering. Among these methods, when the deposition is performed by sputtering, it is preferable that the film deposition gas pressure is in the range of 3 to 100 mTorr, and the electric power to be supplied is in the range of 2 to 20 W/cm$^2$. When the deposition is performed by vacuum deposition, it is preferable that the film deposition gas pressure is in the range of 10 mTorr to 10 Torr.

A target, a vapor deposition source, a vapor deposition target, or a tablet each composed of a vapor deposition material containing an electroconductive metal constituting a thin film of the present invention is used as the vapor deposition source in the physical vapor deposition. When the deposition is performed by vacuum deposition, a vapor deposition source, a vapor deposition target, or a tablet can be appropriately selected in accordance with the composition of the thin film to be deposited. When the deposition is performed by sputtering, a target can be appropriately selected in accordance with the composition of the thin film to be deposited. For example, in the case where a diffuse reflective film made of aluminum or an aluminum alloy is deposited, a vapor deposition source made of pure aluminum or a vapor deposition source made of an aluminum alloy containing a desired alloying element can be used. The reflective film of the present invention deposited on a substrate has the same composition as this vapor deposition source.

A method such as magnetron sputtering or ion beam sputtering can be employed as the sputtering. In particular, magnetron sputtering is preferable from the standpoint that a uniform diffuse reflective film having a large area can be easily deposited.

It is believed that the reason why a diffuse reflective film having the above porous structure is obtained in the present invention is as follows. For example, if a surface of an aluminum thin film or an aluminum alloy thin film is controlled to form a white reflector, an electroconductive white diffuse reflector can be obtained. However, this is not easily realized. It is also known that an aluminum thin film may become tarnished to be white when being formed by physical vapor deposition. For example, it is known that when an aluminum film is deposited under heat by sputtering, irregularities are formed on the surface and the surface becomes tarnished to be white. Furthermore, it is known that the film becomes tarnished to be white by increasing the film deposition gas pressure. However, satisfactory diffuse reflection cannot be realized by merely using these methods, though the surface of the film becomes tarnished to be white.

Consequently, the inventors of the present invention have found that, by mixing hydrogen gas with a film deposition gas, the surface of an electroconductive metal thin film formed can be made porous. In the present invention, a thin film having the above porous structure can be produced by performing a deposition by normal sputtering using a film deposition gas containing hydrogen gas in an amount in the range of 0.1% to 30%. The reason for this is believed to be as follows. During film formation, the electroconductive metal is deposited while hydrogen is temporarily introduced into an electroconductive metal film, and in addition, hydrogen is released from the deposited thin film. Since the film is unevenly grown in this step, formation of a porous structure can be realized.

EXAMPLES

Examples of the present invention will now be specifically described with Comparative Examples.

Example 1

An aluminum diffuse reflective film was formed on a surface of a disc-shaped glass substrate (1737, manufactured by Corning Incorporated) having a thickness of 0.7 mm and a diameter of 5.08 cm (2 inches) using a magnetron sputtering apparatus. In this step, a pure aluminum target with a purity of 4N was used as a sputtering target. The ultimate degree of vacuum was $1.2 \times 10^{-6}$ Torr, and a 3% $H_2$-97% Ar mixed gas was used as a film deposition gas. A DC discharge was performed under the conditions of a film deposition gas pressure of 5 mTorr, a supplied electric power of 10 $W/cm^2$, and a distance between the substrate and the target of 60 mm.

The thickness of the prepared film measured with a stylus contact-type film thickness gauge was 1,000 nm. The electrical conductivity was measured with an electrical conductivity meter by a four-probe method. According to the result, the electrical resistivity of the film was 3.3 µΩcm.

Next, the reflectance of the deposited film was measured with a spectroreflectometer.

First, as a normal measuring method, light having a wavelength in the range of 400 to 800 nm was incident at an angle of incident of −5 degrees with respect to an axis perpendicular to the film surface. Light reflected at an angle of reflection in the range of 5 to 90 degrees was measured. The results are shown in FIG. 1. The reflectance at an angle of reflection of 5 degrees, which is an angle of mirror reflection, was the highest. Although the reflectance decreased with increasing angle, the reflectance remained high. These results showed that a diffuse reflector composed of the glass substrate and the aluminum thin film formed on the surface of the glass substrate was produced.

Figure 2:
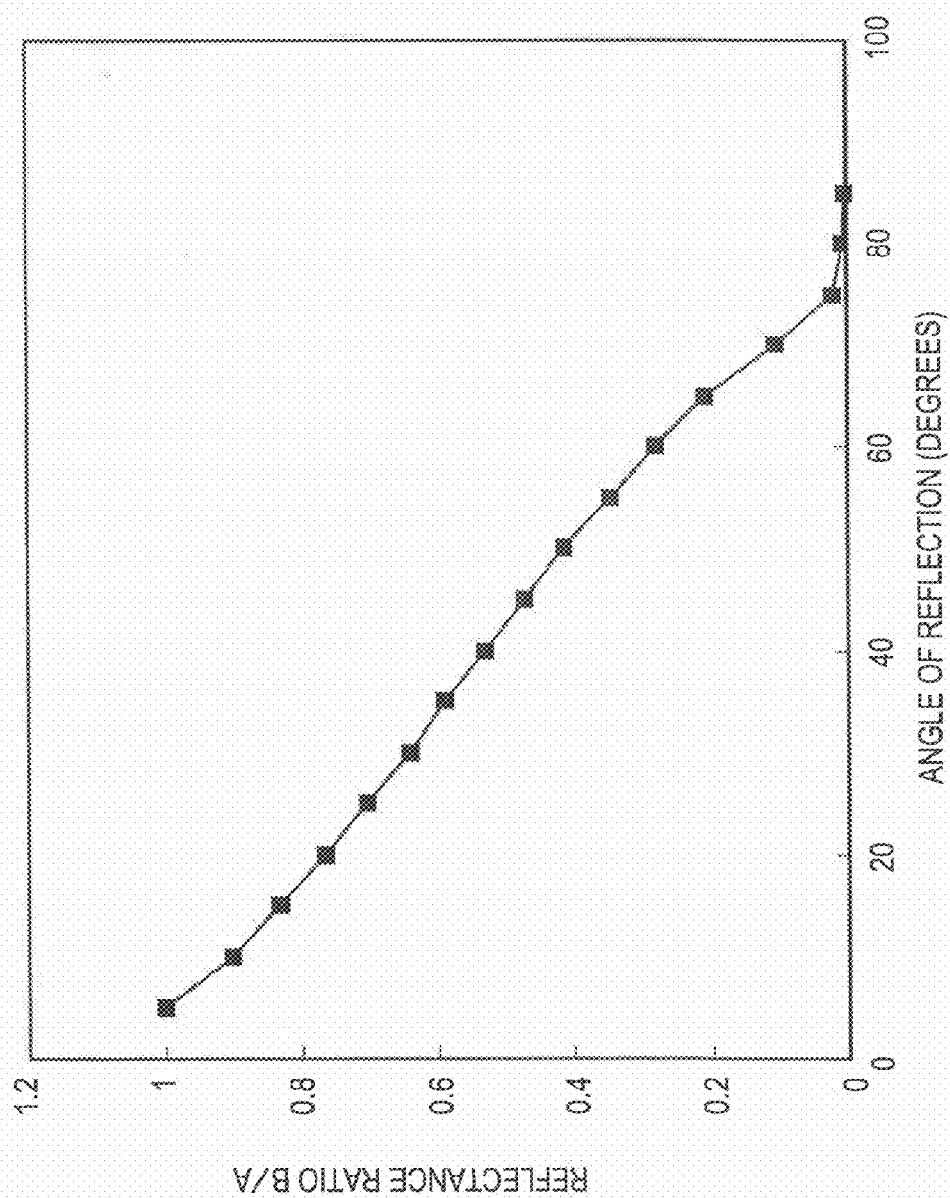
FIG. 2 is a graph showing calculation results of a reflectance ratio in Example 1.

The reflectances of light having a wavelength of 550 nm were extracted from FIG. 1. The ratio (reflectance ratio) B/A of the reflectance B at each angle of reflection to the reflectance A at an angle of reflection of 5 degrees was calculated. The results are shown in FIG. 2. The reflectance ratio at 45 degrees was 0.48.

Figure 3:
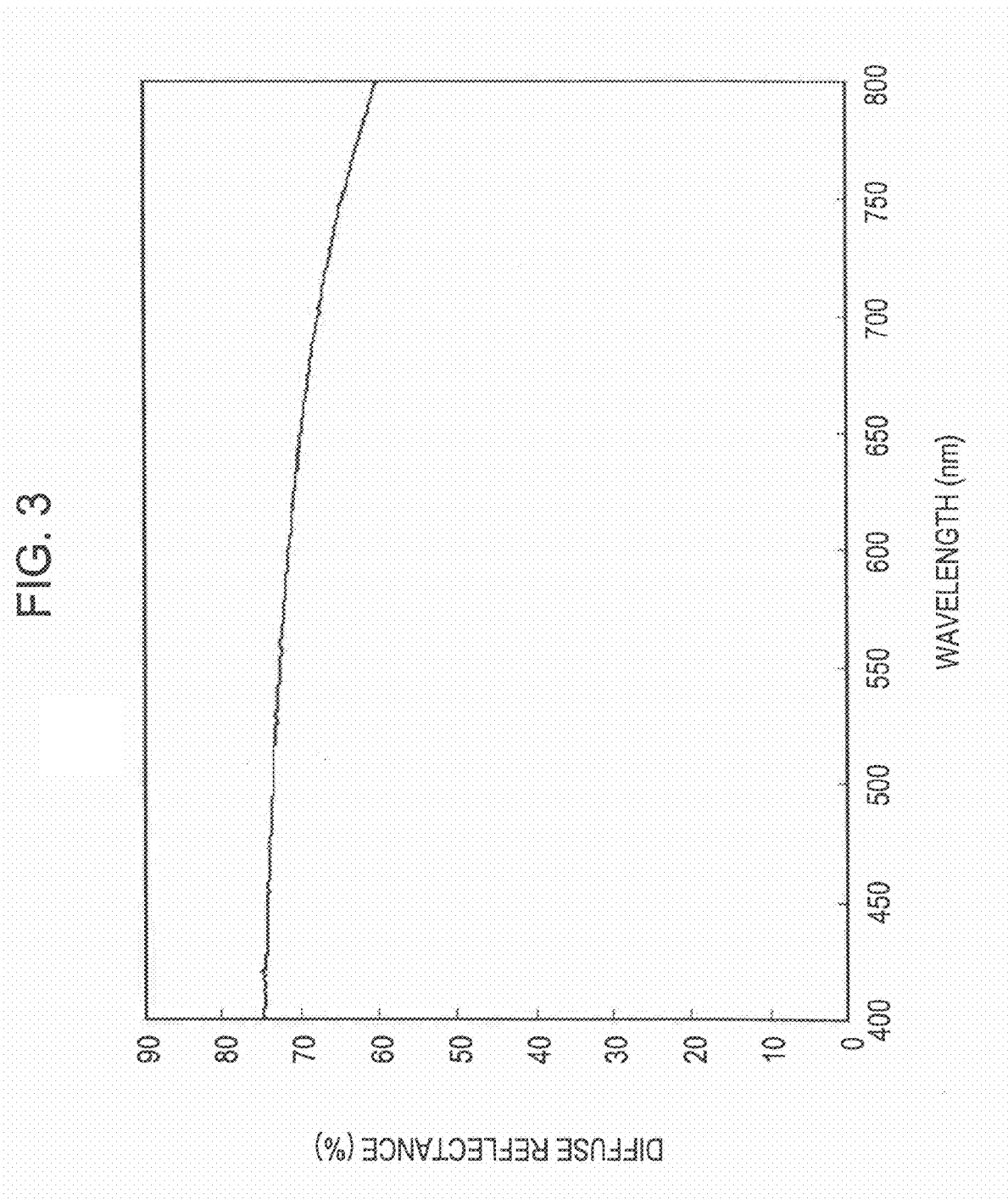
FIG. 3 is a graph showing measurement results of the diffuse reflectance in Example 1.

Next, the diffuse reflectance was measured with an integrating sphere. Here, incident light was incident from a direction perpendicular to the film surface, and diffuse reflectances were measured so that reflection in a direction of regular reflection within ±5 degrees with respect to the perpendicular direction was eliminated. The results are shown in FIG. 3. The diffuse reflectance of light having a wavelength of 550 nm was 72.5%.

Figure 4:
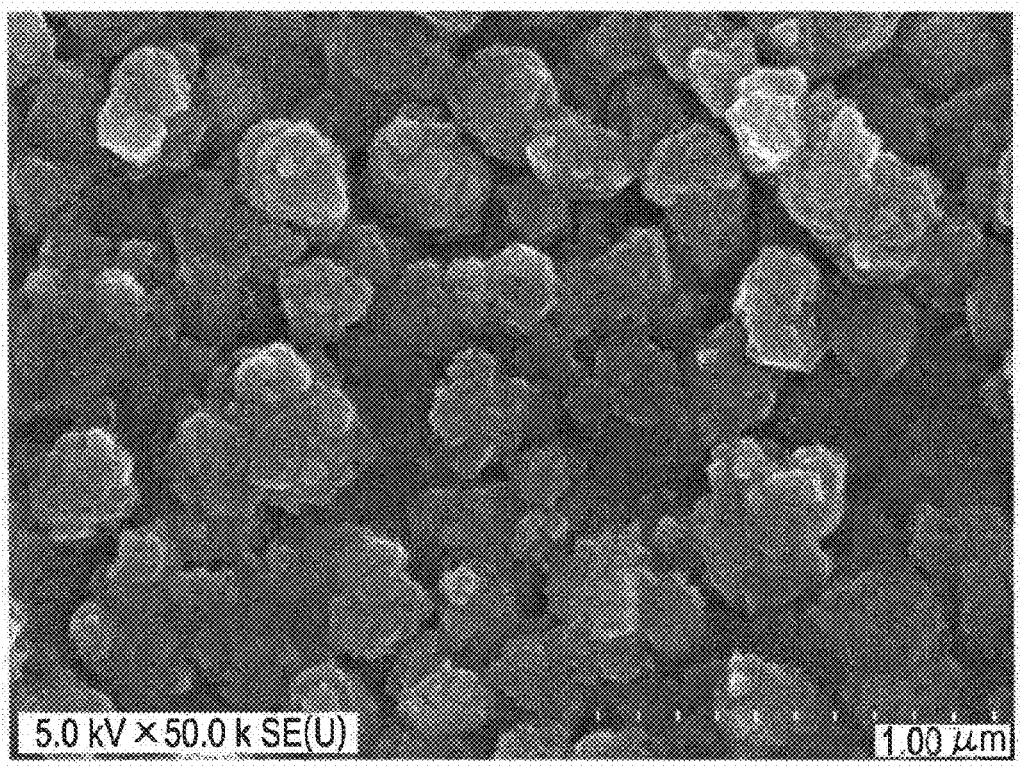
FIG. 4 is a secondary electron image of an electroconductive diffuse reflective film of Example 1 obtained with a scanning electron microscope.

Next, the film surface was observed with a scanning electron microscope (SEM). The observation result of the secondary electron image is shown in FIG. 4. As shown in FIG. 4, the prepared film was composed of crystal grains having a grain diameter in the range of 100 to 400 nm and an average grain diameter of 250 nm. In addition, the crystal grains were not closely arranged. Gaps in the range of 30 to 500 nm were present between arbitrary crystal grains and adjacent crystal grains, though the size of the gaps was not uniform. The average size of the gaps was 265 nm. Furthermore, it was found that each of the crystal grains was composed of finer crystal grains.

Example 2

An aluminum diffuse reflective film having a thickness of 500 nm was formed as in Example 1 except that a 10% $H_2$-90% Ar mixed gas was used as a film deposition gas, and the film deposition gas pressure was 3 mTorr. The thickness of the prepared film was measured with a stylus contact-type film thickness gauge.

Figure 5:
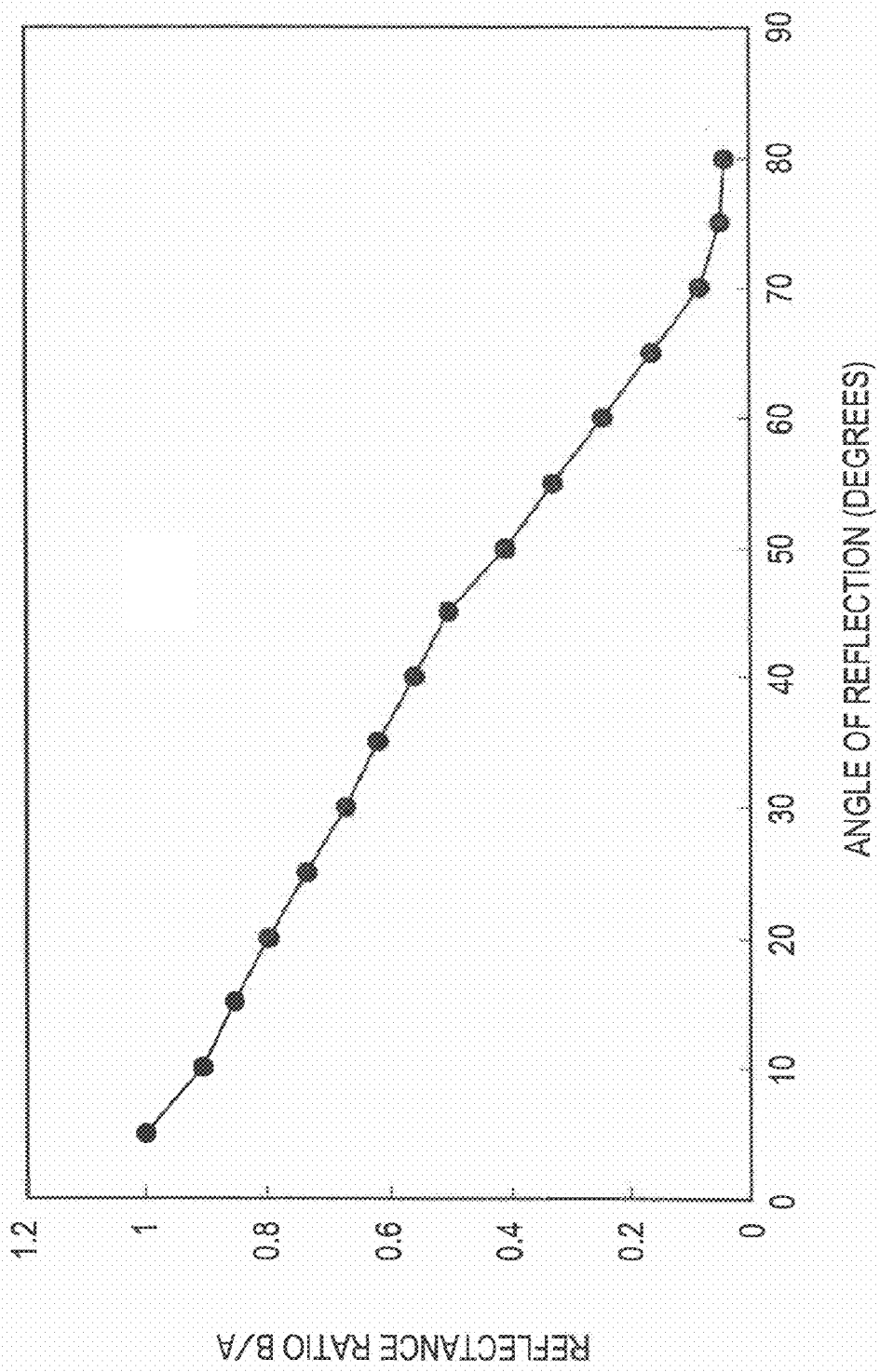
FIG. 5 is a graph showing calculation results of a reflectance ratio in Example 2.
Figure 6:
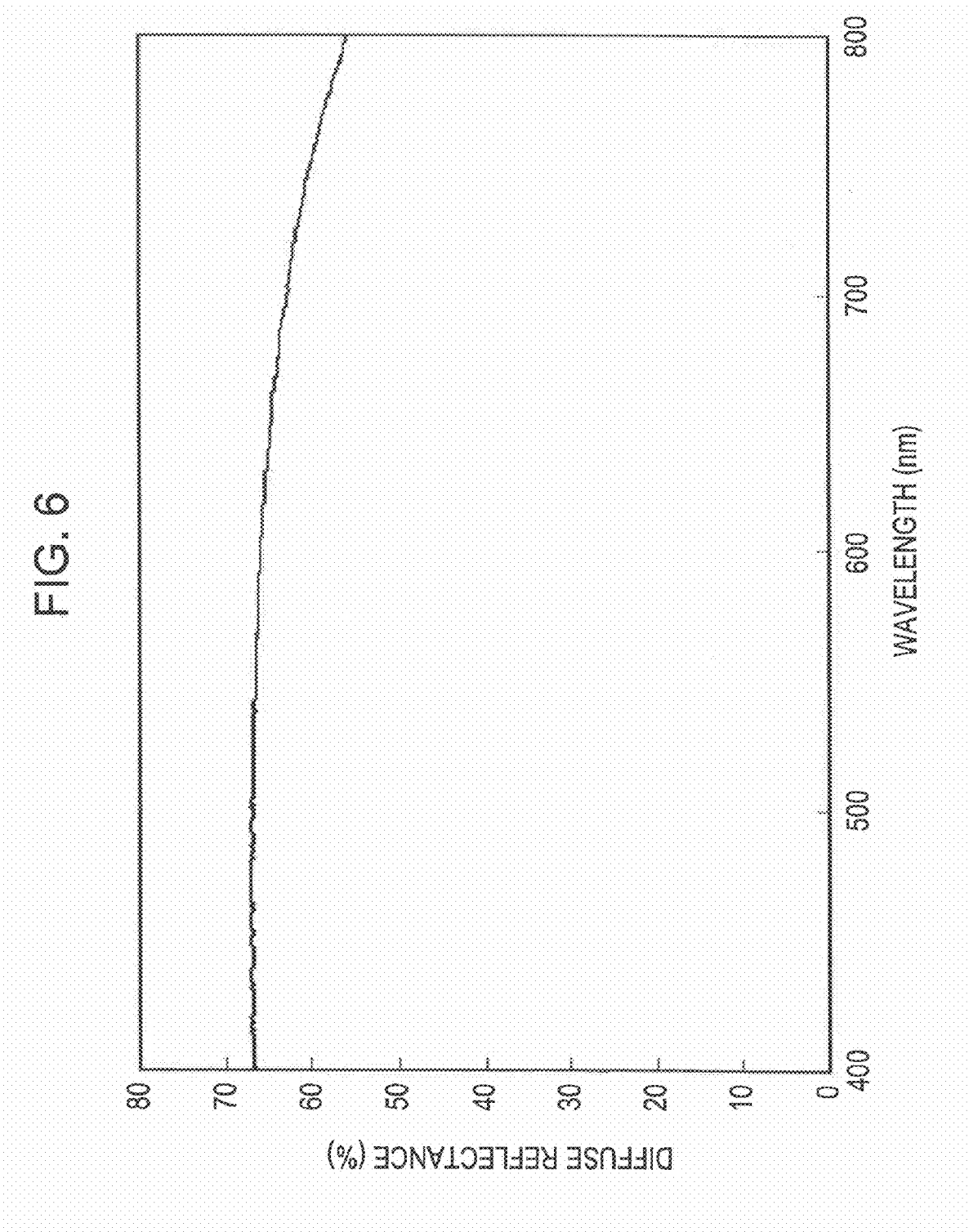
FIG. 6 is a graph showing measurement results of the diffuse reflectance in Example 2.

Next, the measurement of the electrical conductivity by a four-probe method, the measurement of the reflectance with a spectroreflectometer, the calculation of the reflectance ratio B/A, and the measurement of the diffuse reflectance with an integrating sphere were performed using the prepared diffuse reflective film. According to the results, the electrical resistivity was 3.4 µΩcm, the reflectance ratio B/A at 45 degrees was 0.50, and the diffuse reflectance of light having a wavelength of 550 nm was 66.6%. FIG. 5 shows the relationship between the angle of reflection and the calculated reflectance ratio B/A. FIG. 6 shows the measurement results of the diffuse reflectance.

Figure 7:
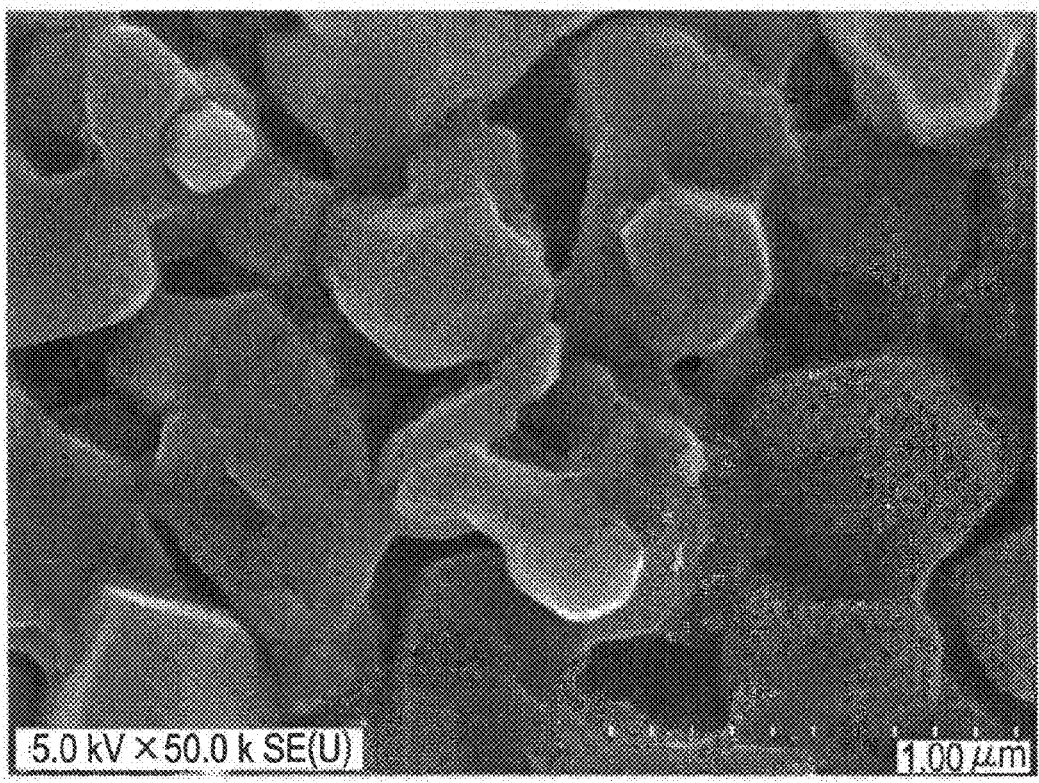
FIG. 7 is a secondary electron image of an electroconductive diffuse reflective film of Example 2 obtained with a scanning electron microscope.

Furthermore, the film surface was observed with a scanning electron microscope (SEM). The observation result of the secondary electron image is shown in FIG. 7. The film was composed of crystal grains having a grain diameter in the range of 500 to 700 nm. The average grain diameter was 600 nm. There were large gaps between crystal grains. The size of the gaps between arbitrary crystal grains and adjacent crystal grains was 100 nm or more and 300 nm or less. The average size of the gaps was 200 nm.

Example 3

An aluminum diffuse reflective film having a thickness of 200 nm was formed as in Example 1 except that the film deposition gas pressure was 10 mTorr and the supplied electric power was 7 $W/cm^2$. The thickness of the prepared film was measured with a stylus contact-type film thickness gauge.

Next, the measurement of the electrical conductivity by a four-probe method, the measurement of the reflectance with a spectroreflectometer, the calculation of the reflectance ratio B/A, and the measurement of the diffuse reflectance with an integrating sphere were performed using the prepared diffuse reflective film. According to the results, the electrical resistivity was 3.6 µΩcm, the reflectance ratio B/A at 45 degrees was 0.47, and the diffuse reflectance of light having a wavelength of 550 nm was 60.5%.

Figure 8:
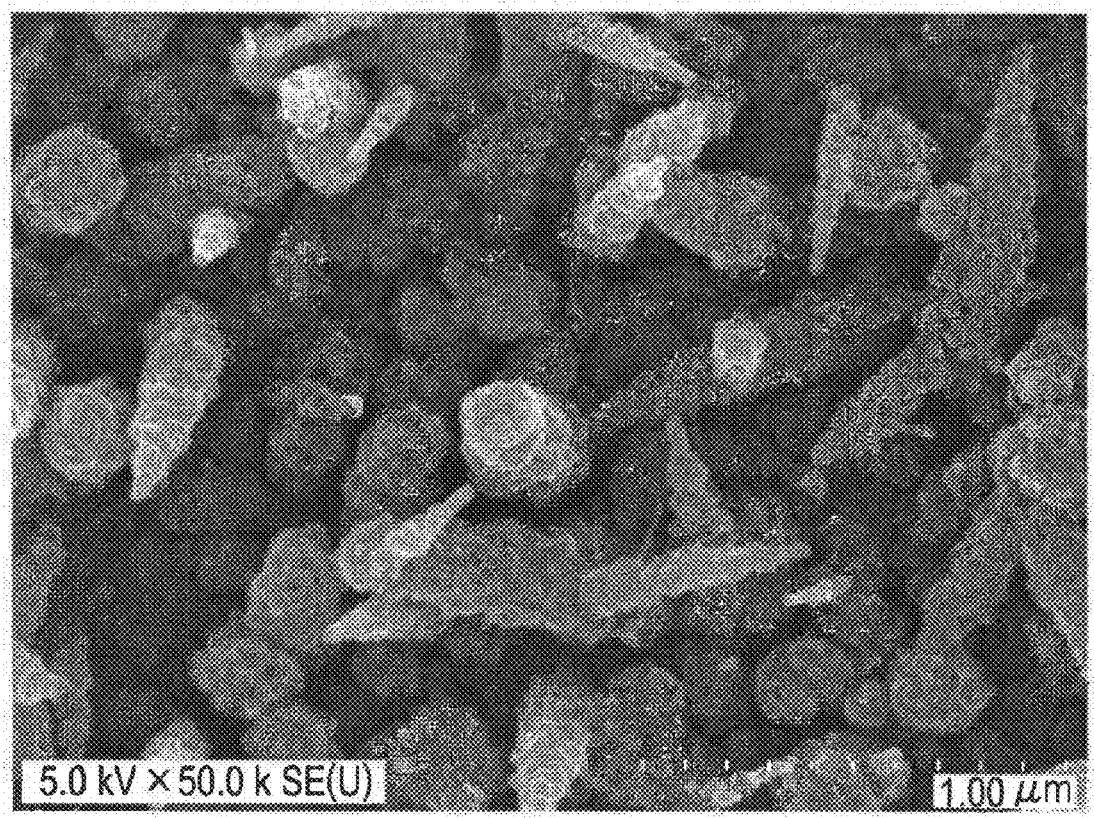
FIG. 8 is a secondary electron image of an electroconductive diffuse reflective film of Example 3 obtained with a scanning electron microscope.

Furthermore, the film surface was observed with a scanning electron microscope (SEM). The observation result of the secondary electron image is shown in FIG. 8. The film was composed of protruding crystal grains having a grain diameter in the range of 150 to 200 nm. The average grain diameter was 175 nm. The crystal grains were not closely arranged. Gaps of 50 nm or more and 400 nm or less were present between arbitrary crystal grains and adjacent crystal grains, though the size of the gaps was not uniform. The average size of the gaps was 225 nm. Furthermore, each of the protruding crystal grains was composed of finer crystal grains.

Comparative Example 1

An aluminum film having a thickness of 500 nm was deposited as in Example 1 except that 100% Ar gas was used as a film deposition gas, the film deposition gas pressure was 2 mTorr, and the supplied electric power was 7 $W/cm^2$. The thickness of the prepared film was measured with a stylus contact-type film thickness gauge.

Figure 9:
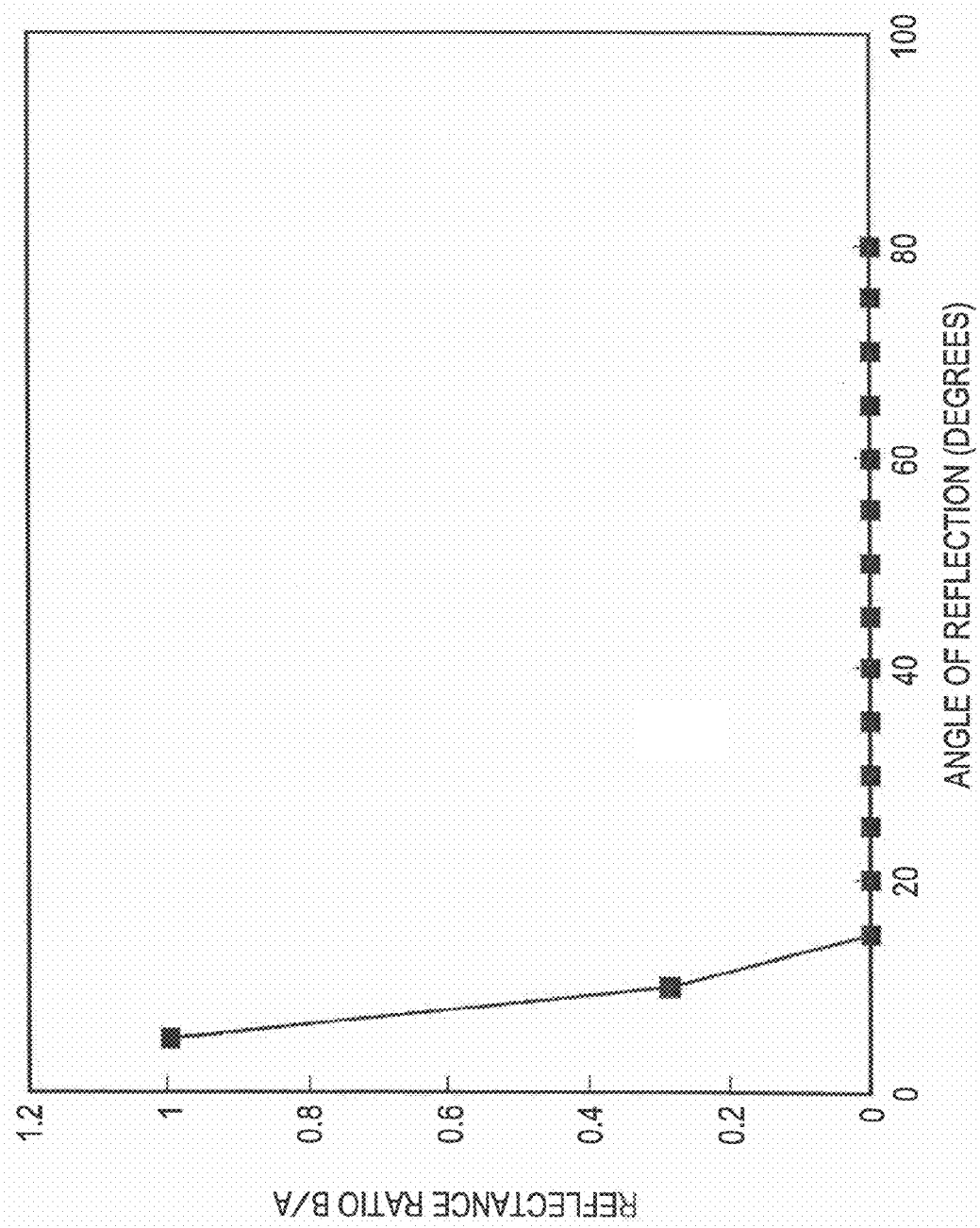
FIG. 9 is a graph showing calculation results of a reflectance ratio in Comparative Example 1.

Next, the measurement of the electrical conductivity by a four-probe method, the measurement of the reflectance with a spectroreflectometer, the calculation of the reflectance ratio B/A, and the measurement of the diffuse reflectance with an integrating sphere were performed using the prepared aluminum film. According to the result, the electrical resistivity was 3.0 μΩcm. FIG. 9 shows the relationship between the angle of reflection and the calculated reflectance ratio B/A. Almost only mirror reflection occurred, and the reflectance at an angle of incidence of −5 degrees and an angle of reflection of 5 degrees was 89%. The reflectance at an angle of reflection of 45 degrees was equal to or lower than the measurement limit, and the reflectance ratio was 0.0001 or lower, which was equal to or lower than the measurement limit. Furthermore, the diffuse reflectance of light having a wavelength of 550 nm was 0.01% or lower, which was equal to or lower than the measurement limit.

Figure 10:
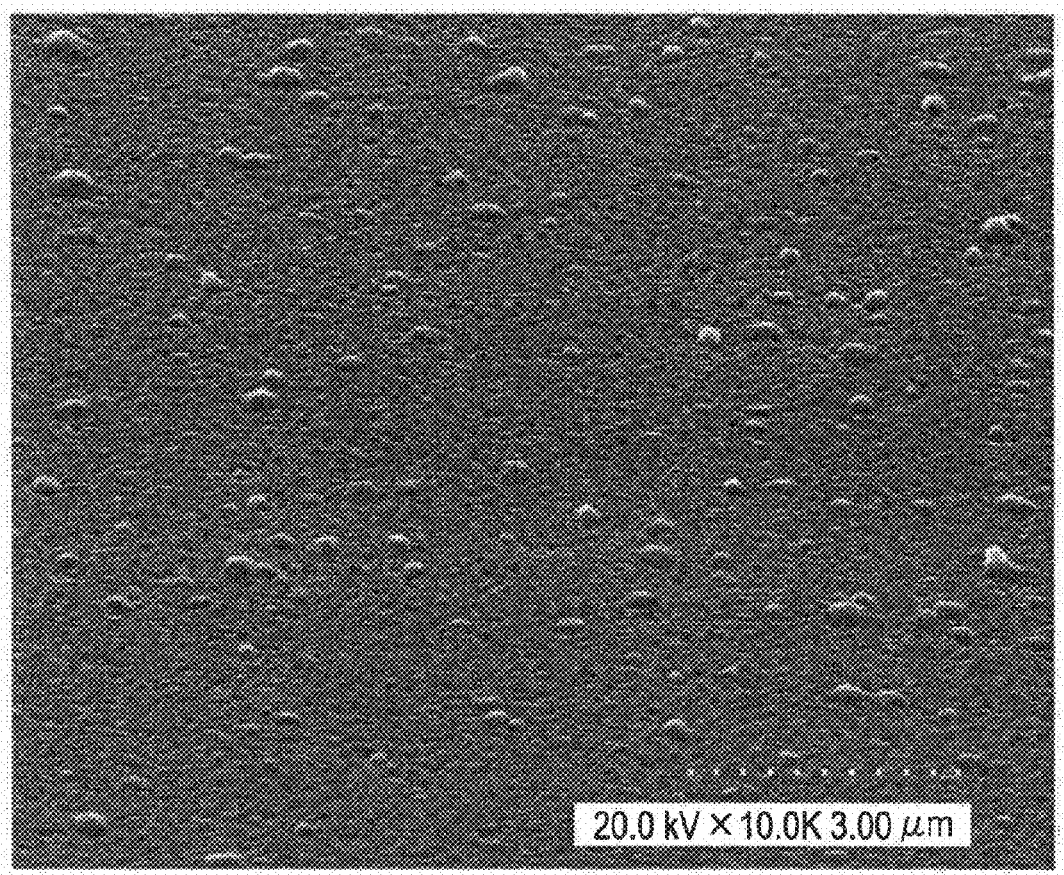
FIG. 10 is a secondary electron image of an aluminum film of Comparative Example 1 obtained with a scanning electron microscope.

Next, the film surface was observed with a scanning electron microscope (SEM). The observation result of the secondary electron image is shown in FIG. 10. The film surface was substantially smooth. Although protrusions were observed in some places, the crystal grains were closely arranged and no gaps were observed. The crystal grain diameter was in the range of 1.1 to 2 μm.

Comparative Example 2

An aluminum film having a thickness of 5,000 nm was deposited as in Example 1 except that 100% Ar gas was used as a film deposition gas, the film deposition gas pressure was 7 mTorr, and the supplied electric power was 7 W/cm². The thickness of the prepared film was measured with a stylus contact-type film thickness gauge.

Figure 11:
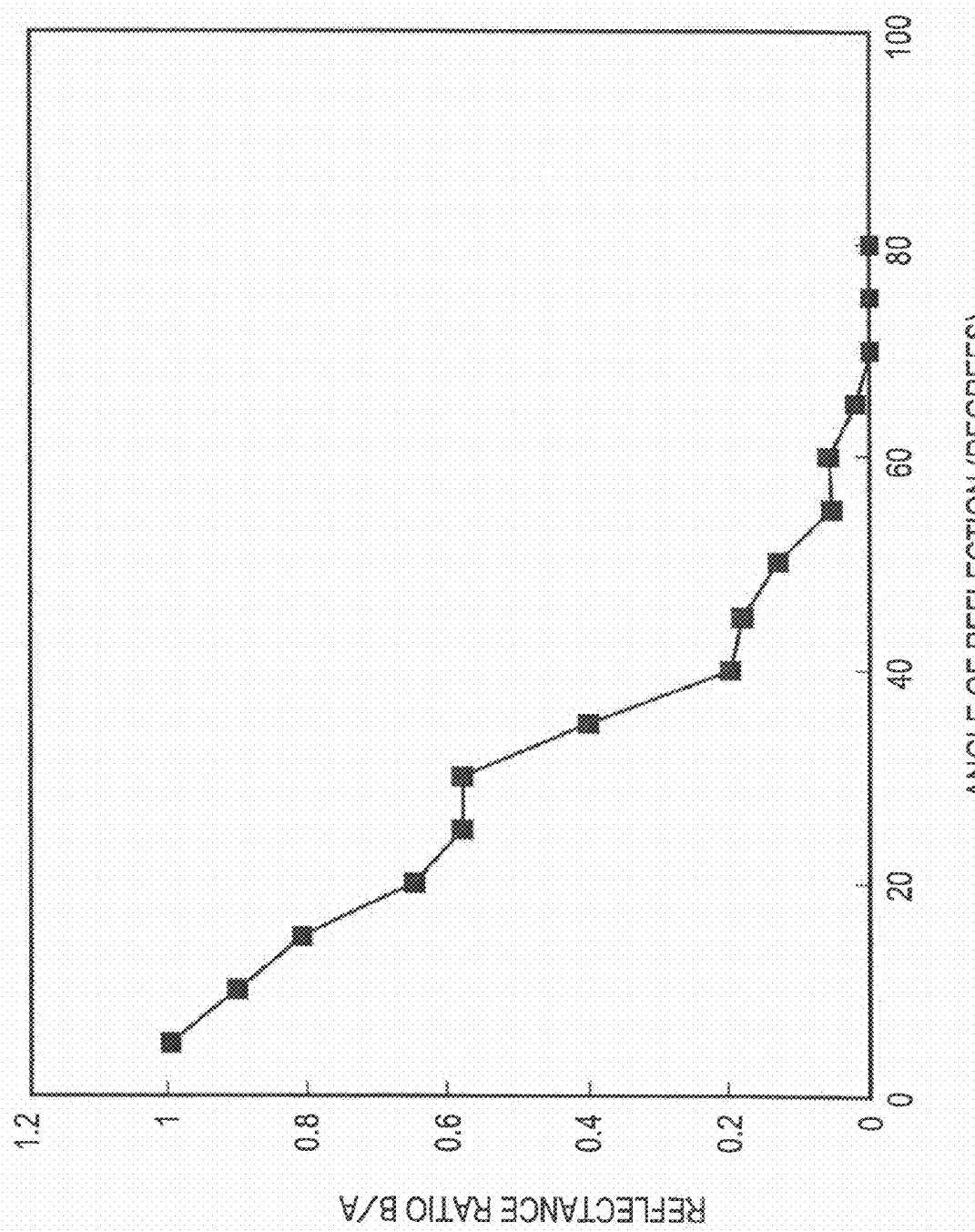
FIG. 11 is a graph showing calculation results of a reflectance ratio in Comparative Example 2.
Figure 12:
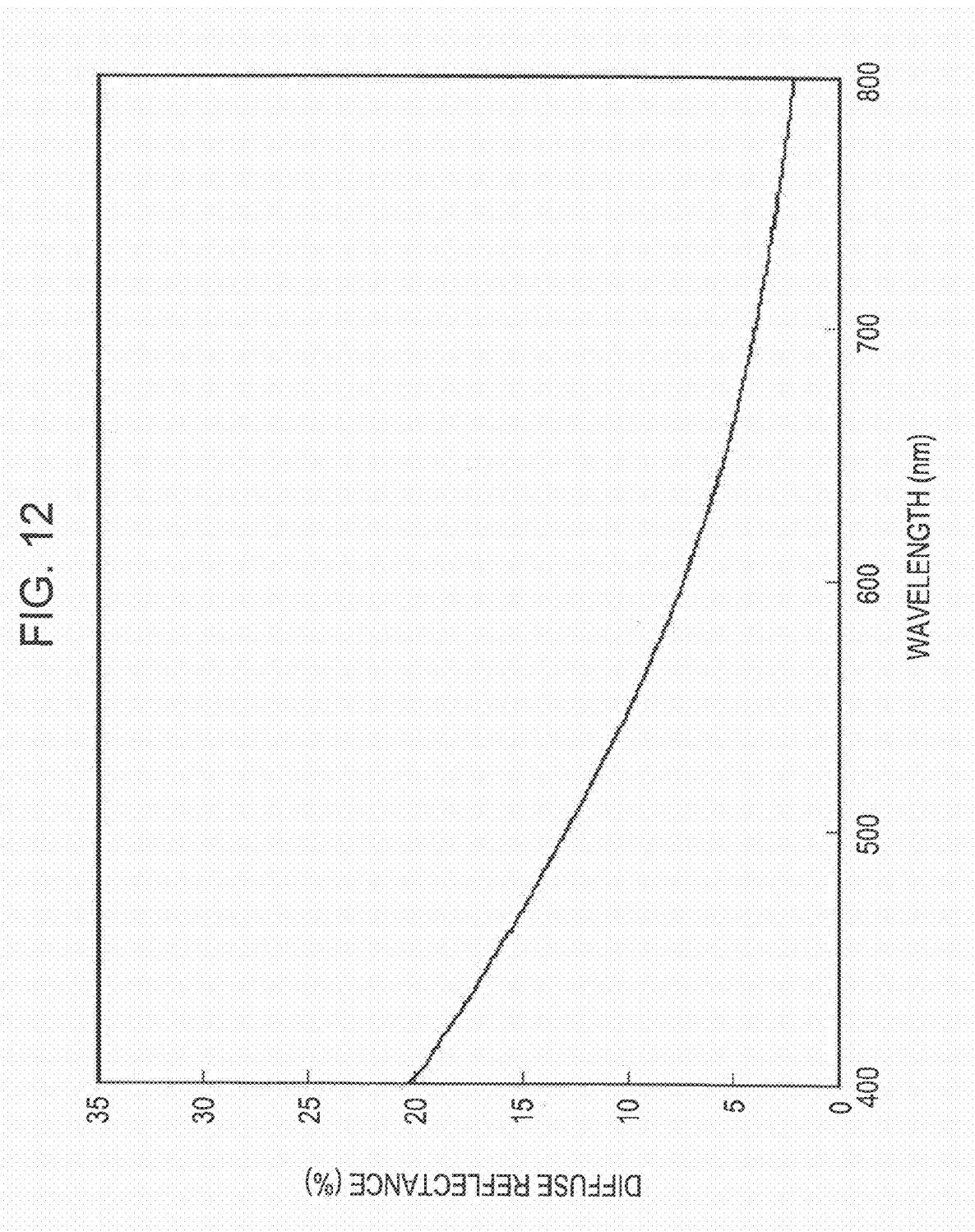
FIG. 12 is a graph showing measurement results of the diffuse reflectance in Comparative Example 2.

Next, the measurement of the electrical conductivity by a four-probe method, the measurement of the reflectance with a spectroreflectometer, the calculation of the reflectance ratio B/A, and the measurement of the diffuse reflectance with an integrating sphere were performed using the prepared aluminum film. According to the result, the electrical resistivity was 3.0 μΩcm. The reflectance ratio B/A at 45 degrees was 0.18, which was insufficient. FIG. 11 shows the relationship between the angle of reflection and the calculated reflectance ratio B/A. FIG. 12 shows the measurement results of the diffuse reflectance. Furthermore, the diffuse reflectance of light having a wavelength of 550 nm was 10.0%, which was equal to or lower than the measurement limit and insufficient.

Figure 13:
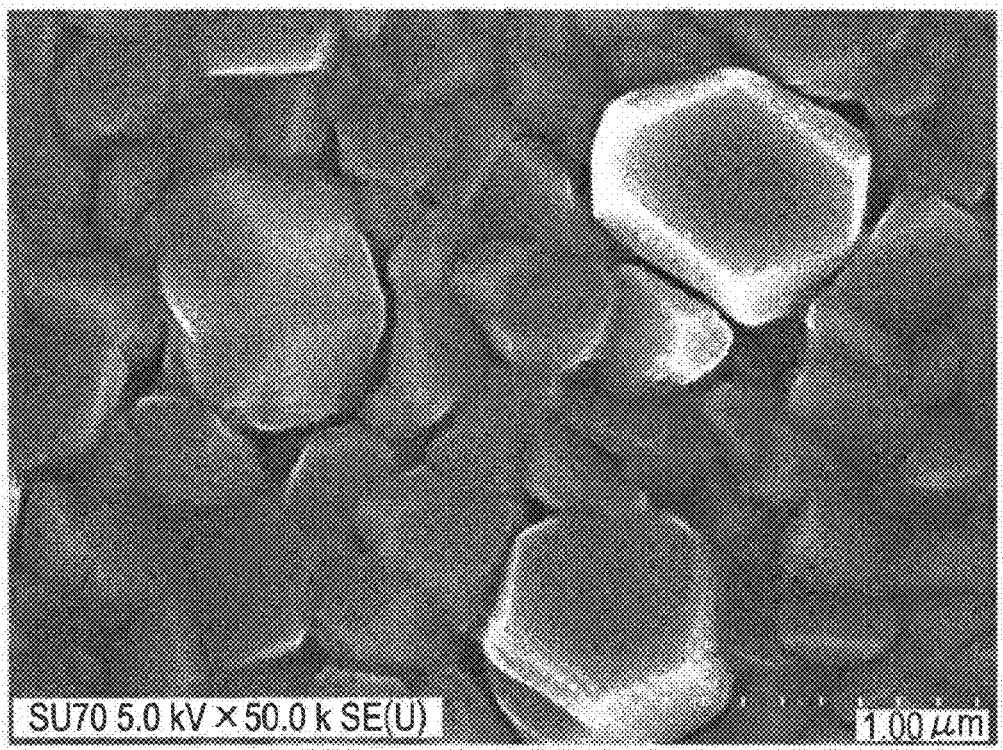
FIG. 13 is a secondary electron image of an aluminum film of Comparative Example 2 obtained with a scanning electron microscope.

Next, the film surface was observed with a scanning electron microscope (SEM). The observation result of the secondary electron image is shown in FIG. 13. Among crystal grains grown on the film surface, large crystal grains had a grain diameter of 1 μm or more. These crystal grains were closely arranged. There were no gaps between the crystal grains.

Examples 4 to 8 and Comparative Examples 3 and 4

An aluminum film or an aluminum alloy film having a thickness shown in Table 1 was deposited as in Example 1 except that the amount of hydrogen in the film deposition gas and the film deposition gas pressure were changed as shown in Table 1. The film thickness was controlled by changing the deposition time and the film deposition gas pressure.

The measurement of the electrical conductivity by a four-probe method, the measurement of the reflectance with a spectroreflectometer, the calculation of the reflectance ratio B/A, and the measurement of the diffuse reflectance with an integrating sphere were performed using the prepared aluminum film or aluminum alloy film. Furthermore, the surface of each of the films was observed with a scanning electron microscope (SEM), and the average crystal grain diameter and the average gap between crystal grains were calculated. The results are shown in Table 1.

TABLE 1

| | | Example 4 | Example 5 | Example 6 | Example 7 | Example 8 | Comparative Example 3 | Comparative Example 4 |
|---|---|---|---|---|---|---|---|---|
| Film composition | | Al-mass % X* | Al | Al | Al | Al-3% Mg | Al-12% Si | Al | Al |
| Film thickness | nm | 3000 | 120 | 5000 | 2000 | 2000 | 40 | 22000 |
| Optical reflectance ratio | B/A | 0.31 | 0.42 | 0.52 | 0.42 | 0.38 | 0.001 | |
| Diffuse reflectance | % | 42.5 | 51 | 48 | 51 | 40.6 | 0.001 | |
| Electrical resistivity | μΩcm | 3.6 | 3.6 | 4 | 10.3 | 320 | 3.5 | |
| Average grain diameter of crystal grains | nm | 300 | 500 | 120 | 350 | 480 | 600 | |
| Average gap between crystal grains | nm | 200 | 300 | 60 | 220 | 600 | 0 | |
| Amount of hydrogen | % | 0.1 | 1 | 20 | 3 | 3 | 0 | |
| Film deposition gas pressure | mTorr | 7 | 7 | 10 | 10 | 10 | 2 | |
| Remarks | | | | | | | | Measurements could not be performed because a large portion of the film was detached. |

*Note: X represents an alloying element.

Example 4 is an Example in which the amount of hydrogen was 0.1%. Example 5 is an Example in which the amount of hydrogen was 1%. Example 6 is an Example in which the amount of hydrogen was 20%. Each of Examples 7 and 8 is an Example in which an aluminum alloy was used. In Comparative Example 3, the film thickness was 40 nm, and satisfactory diffused reflection could not be performed. In Comparative Example 4, the film thickness was excessively large, and thus, a desired diffuse reflector could not be obtained.

What is claimed is:

1. An electroconductive diffuse reflective film comprising:
an electroconductive metal,
wherein the electroconductive diffuse reflective film has a porous structure in which crystal grains having an average grain diameter of 50 nm or more and 1,000 nm or less are separately arranged at intervals of 10 nm or more and 800 nm or less on average.

2. The electroconductive diffuse reflective film according to claim 1, wherein each of the crystal grains is composed of a plurality of microcrystals finer than the crystal grains.

3. The electroconductive diffuse reflective film according to claim 1, wherein the thickness of the electroconductive diffuse reflective film is 50 nm or more and 20 μm or less.

4. The electroconductive diffuse reflective film according to claim 1, wherein the electroconductive metal is aluminum or an aluminum alloy.

5. The electroconductive diffuse reflective film according to claim 1, wherein the electrical resistivity of the electroconductive diffuse reflective film is 2.7 μΩcm or more and 100 μΩcm or less.

6. The electroconductive diffuse reflective film according to claim 1, wherein a reflectance ratio B/A of a reflectance B of light having a wavelength of 550 nm incident at an angle of incidence of −5 degrees and reflected at an angle of reflection of 45 degrees to a reflectance A of light having a wavelength of 550 nm incident at an angle of incidence if −5 degrees and reflected at an angle of reflection of 5 degrees with respect to a direction perpendicular to the surface of the film, is 0.2 or more and 0.6 or less.

7. The electroconductive diffuse reflective film according to claim 1, wherein the diffuse reflectance of light having a wavelength of 550 nm is 30% or more and 90% or less.

* * * * *